United States Patent [19]

Beaman et al.

[11] Patent Number: 5,079,567
[45] Date of Patent: Jan. 7, 1992

[54] LEAF-SPRING ASSEMBLY FOR LED PRINTHEAD

[75] Inventors: Bryan A. Beaman, Churchville; Richard N. Capobianco, Rochester, both of N.Y.

[73] Assignee: Eastman Kodak Company, Rochester, N.Y.

[21] Appl. No.: 663,489

[22] Filed: Mar. 4, 1991

[51] Int. Cl.⁵ .................... G01D 15/14; H01L 23/06; H02B 1/56; H05K 7/20
[52] U.S. Cl. ................................ 346/107 R; 357/81; 361/386; 361/388
[58] Field of Search ............... 346/107 R, 1.1, 139 R; 357/81, 17, 45, 79; 313/500; 362/800; 361/386, 383, 388, 389; 108/37, 136

[56] References Cited

U.S. PATENT DOCUMENTS

| | | | |
|---|---|---|---|
| 3,946,276 | 3/1976 | Braun et al. | 357/79 X |
| 4,193,444 | 3/1980 | Boyd et al. | 361/388 X |
| 4,314,311 | 2/1982 | Seytre et al. | 361/386 |
| 4,549,602 | 10/1985 | Espinoza | 361/383 X |
| 4,821,051 | 4/1989 | Hediger | 346/160 X |

Primary Examiner—Benjamin R. Fuller
Assistant Examiner—David Yockey
Attorney, Agent, or Firm—Norman Rushefsky

[57] ABSTRACT

A non-impact printhead such as an LED printhead includes a plurality of modular circuit assemblies, each including a plurality of recording elements and associated integrated circuit drivers. Each modular circuit assembly is mounted upon a tile. Rails are attached to the underside of the tiles to join the tiles together. A heatsink supports the tiles. The tiles are urged into engagement with the heatsink by cantilevered leaf springs.

11 Claims, 3 Drawing Sheets

LEAF-SPRING ASSEMBLY FOR LED PRINTHEAD

CROSS REFERENCE TO RELATED APPLICATION

This application is related to U.S. application Ser. No. 07/663,3451, filed on even date herewith in the names of Bryan Beaman et al and entitled "Z-Axis Dimensional Control in Manufacturing an LED Printhead."

BACKGROUND OF THE INVENTION

1. Field of the Invention

This invention relates, in general, to non-impact printheads and more specifically, to optical printheads such as LED printheads for use in copiers, duplicators and printers.

2. Description of the Prior Art

Optical printheads are used in copiers, duplicators and printers to expose a photoconductive surface or film in the apparatus in such a manner that a latent image is formed on the film. The image is later developed and transferred to paper for producing a hard copy output from the apparatus. Normally, optical printheads use light-emitting diodes (LED's) to generate or produce the radiation necessary to expose the photoconductive film. Such printheads may also be used to expose photographic film or other photosensitive materials. In conventional printheads, the LED's are arranged in a linear array of LED's having a designed density to provide a resolution of a predetermined number of dots per inch. In other words, the greater the number of dots per inch desired to be printed, the greater will be the number of LED's grouped together in a linear length. In high resolution printheads, the requirements for the spacing between the LED's becomes critical.

In most cases, the LED's are provided on separate chip assemblies with each chip having several LED's such as 128 per chip. Printheads having several thousands LED's in a linear array, therefore, require many chips to construct such an array. Since any spacing between the chips which is greater than the spacing between the individual LED segments on each chip will produce undesirable prints or copies, it has been disirable, according to the prior art, to mount the chips as closely to the specified pitch between adjacent LED's as possible. With lower resolution systems, this has not become a major problem. However, with the desire to go to higher resolution printing, and thus more closely spaced LED's, the spacing in the printhead between the LED chips is of critical significance. Not only is it a mechanical problem in spacing the LED chips, it becomes a problem of thermal expansion since printheads can develop a considerable amount of heat. Thus, regardless of the ability to position the LED chips close together because of the structure of the chips, unless some means for compensating for the expansion of the printhead due to changes in temperature are present, a satisfactory printhead cannot be obtained for high resolution printing.

Thermal expansion of the printhead elements also can cause mechanical failure between the bonds of various members and surfaces within the printhead. In order to prevent this type of failure, it is necessary to allow for the difference in the thermal coefficient of expansion of the various members and materials used to construct the printhead. Therefore, it is desirable to provide an optical printhead which can have the LED's arranged for high density printing and which can compensate for or tolerate materials in the construction of the printhead having significantly different coefficients of thermal expansion.

There is disclosed in U.S. Pat. No. 4,821,051 an optical LED printhead. The printhead includes a main printed circuit board having a rectangular opening therein. Modular daughter boards, or tiles, are arranged within the rectangular opening of the printed circuit board. Each of these tiles includes chips and circuitry containing a string of light-emitting diodes. The tiles are constructed of a stainless steel material with a gold coating having a thermal coefficient of expansion substantially the same as that of the elements and chips bonded thereto to form the circuit on the tile. Interconnection between the circuits is accomplished by small jumper wires.

Each of the separate modular tiles used to construct the optical printhead is bonded to a backing plate, or mother board, which is also constructed of stainless steel to match the thermal coefficient of expansion of the individual tiles. The backing plate is mounted underneath the printed circuit board and between the printed circuit board and a rigid aluminum heatsink or heat-dissipating structure with a precise flat mounting surface which is used to remove heat from the printhead elements. In order to provide a workable system even though the thermal coefficients of expansion of the heatsink and the backing plate are different, a system of guides and pins is used. This permits relative movement between the backing plate and the heatsink but limits the direction of this movement so that it will be consistent with the alignment of the LED's.

In an improvement described in U.S. application Ser. No. 07/455,125, filed Dec. 22, 1989 the main printed circuit is eliminated and signal distribution is accomplished by daisy-chaining signals from one tile to the next tile through interconnection of corresponding spreader boards located on each tile.

While the above constructions work well, it is an object of the invention to further simplify construction of such LED printheads.

SUMMARY OF THE INVENTION

These and other objects which will become apparent from reading of the description provided below are realized by a non-impact printhead assembly, comprising: a plurality of modular circuit assemblies each including a plurality of recording elements and associated integrated circuit drivers; a plurality of circuit assembly mounting tiles; a rail mounted to said tiles; a heatsink for supporting the tiles; and means engaging the rail for resiliently urging the tiles into intimate thermal coupling with the heatsink.

DESCRIPTION OF THE PREFERRED EMBODIMENTS

Because apparatus of the type described herein are well known, the present description will be directed in particular to elements forming part of or cooperating more directly with the present invention.

Figure 1:
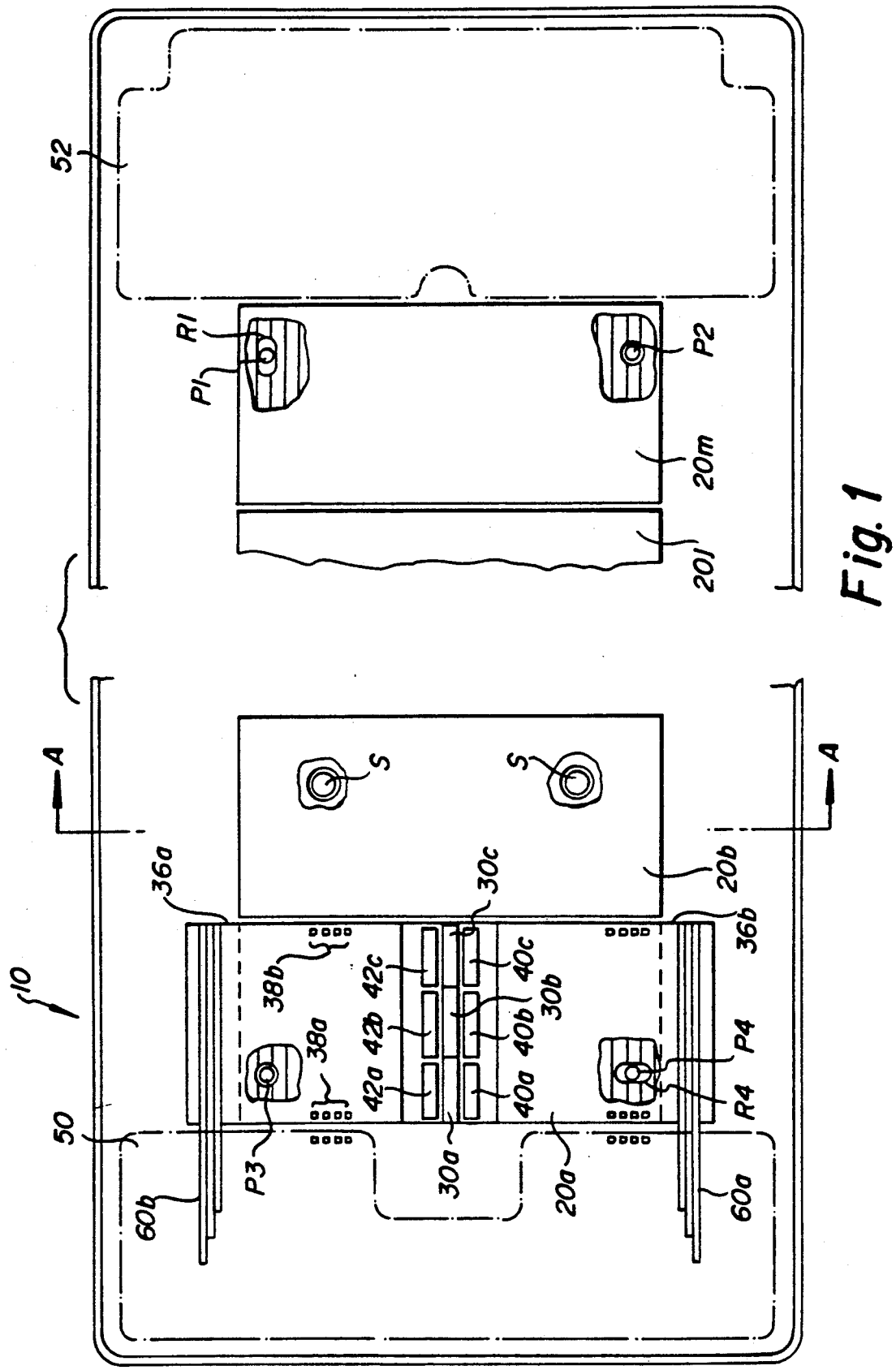
FIG. 1 is a plan view shown in schematic of a printhead assembled in accordance with the invention.
Figure 2:
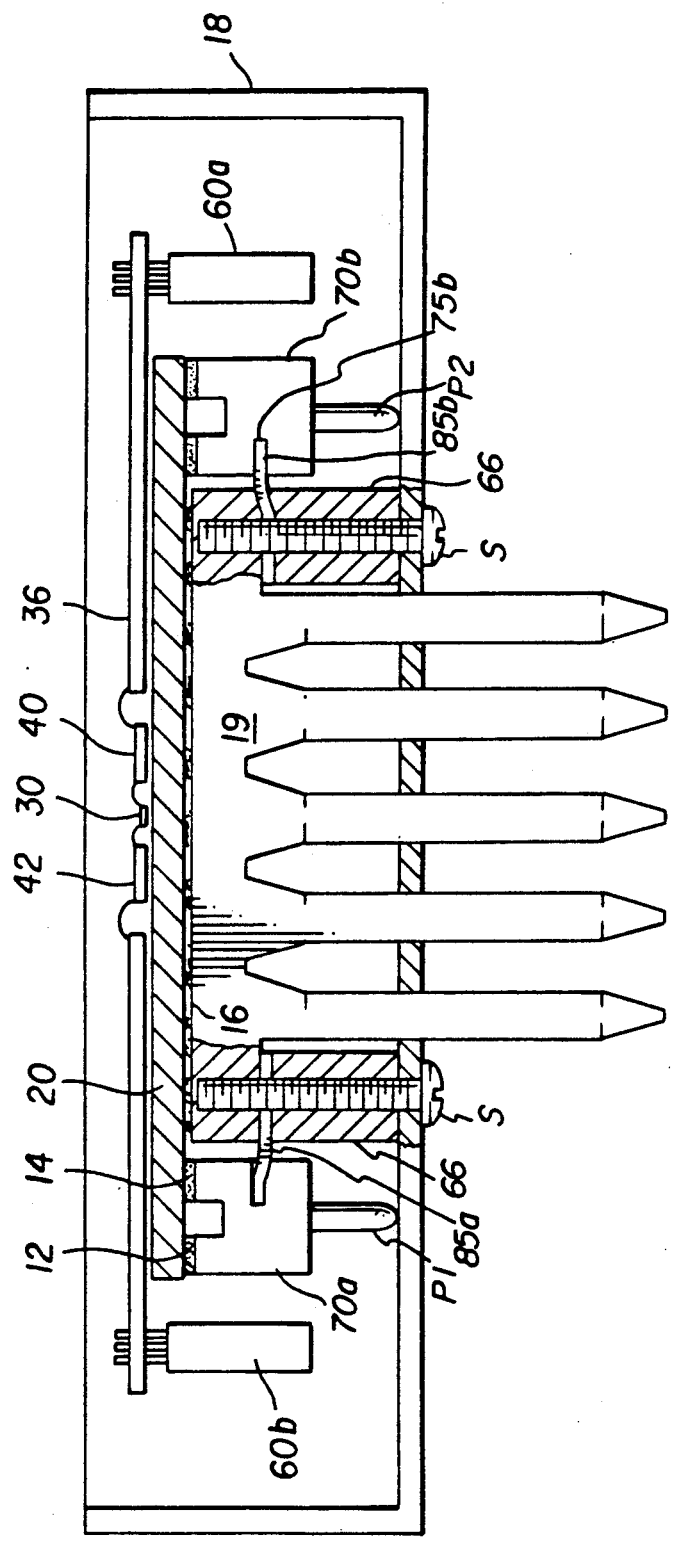
FIG 2 is a section of the printhead taken along the line A—A of FIG. 1.
Figure 3:
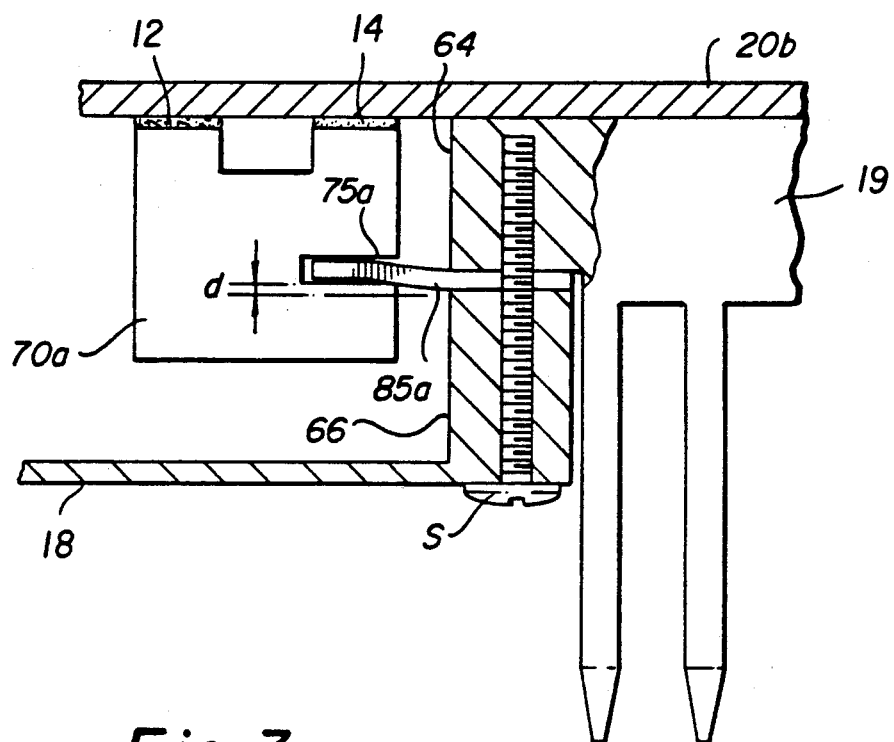
FIG. 3 is an enlarged section of a portion of the printhead illustrated in FIg. 2.

With reference to FIG. 1-3, an LED printhead 10 is formed using a series of tile modules 20a, b, ... l, m. Tile module 20a is typical and has a series of gallium arsenide or gallium aluminum arsenide LED dice 30a, 30b, 30c mounted end to end to form a row of such dice on a central axis of the front face of the tile. To each side of the row of dice, there will be provided a corresponding number of integrated circuit silicon driver chips 40a,b,c and 42a,b,c so that two driver chips are associated with each LED die. Typically, an LED die 30 may have say 128 LED's arranged in say a row so that each driver chip 40, 42 drives 64 of the LED's formed within a corresponding die. Also, typically, the silicon driver chips each have 64 channels, i.e. current-generating circuits that may provide regulated driving currents to respective LED'S that are selected to be activated. Printed circuit or spreader boards 36a, 36b are mounted to the front face of the tile to provide a means for distribution of electrical signals such as data, power and clock signals to the driver chips. A specific spreader board that is preferred is described in U.S. application Ser. No. 07/455,125, filed Dec. 22, 1989. The spreader boards will be located on the tile to the outboard side of each row of driver chips.

The spreader boards each include a series of bond pads 38a, 38b along opposite edges thereof for connection of signals to adjacent spreader boards or to termination boards 50, 52 that are present at the ends of printhead 10.

As noted with more detail in U.S. application Ser. No. 07/455,125, bus bar assemblies 60a, 60b are provided for carrying power and ground signals along the length of the printhead to the various spreader boards for distribution of such signals to the various driver chips. Only tile module 20a is illustrated to show the various components mounted on the tile. In addition to the illustrated components, there will be bonding wires for connecting such components together.

As may be seen in FIG. 2, the tiles 20 are mounted upon stainless steel rails 70a, 70b which rails extend for the length of the printhead; i.e., the length of the tile assemblies, so as to support the tiles thereon. The tiles are assembled one by one onto the rails 70a, 70b using adhesive. Each tile is prepared in accordance with the method described in the cross-referenced application so that the assembly of driver chips and LED dice are accurately formed on the tile. With the spreader boards and wiring also attached to the tile, the tile module may be tested and suitably burned in. Satisfactory tile modules are then carefully assembled to the metal rails 70a, 70b to ensure that all the LED's are accurately aligned in a row. Prior to placement of the tile on the rails, the rails are each covered with two different adhesives. Each rail is a two-legged rail with the inner leg receiving a two-part structural epoxy adhesive 14 that can be cured at room temperature. The outer leg of each rail receives a UV curable epoxy 12 that is promptly cured by application of UV light after each tile has been placed in position on the rails. After all the tiles have been mounted on the rails, the assembly is placed upon a heatsink 19. The heatsink surface that is to be thermally coupled to the undersides of the tiles is coated with a thermal grease 16 or in lieu thereof, a thin sheet (0.001" thick) of aluminum foil ooated with thermally eleotrioally conductive rubber that serves as a grease replacement material may be used between the heatsink and the tiles. This construction allows for thermal expansion of the tiles relative to the heatsink by allowing sliding movement between them.

In order to ensure intimate thermal coupling between the tiles and the heatsink, the tiles are spring-urged towards the heatsink using cantilevered spring steel leaf springs 85a, 85b. The leaf springs shown in FIG. 3 extend the length of the rails and are positioned each within a slot formed within each rail. As shown in FIG. 3, a bottom cover 18 for the printhead includes a central upstanding wall on either side of the sides of the heatsink. Side extensions 64 of the heatsink extend above these side walls 66. Screw holes are provided in these upstanding walls 66 and the side extensions 64 to the heatsink to allow screws, S, to connect the side extensions 64 to the bottom cover. The leaf springs 85a, 85b are also positioned between the upstanding walls 66 and the side extensions 64 of the heatsink and include apertures through which screws, S, can pass so that when clamped together by the screws, the leaf springs 85a, 85b cantileveredly extend into the slots 75a, 75b, respectively, in the rails. An offset "d" is provided between the bottom walls of the slots 75a, 75b and the top surfaces of the upstanding walls 66 prior to clamping by the screws. Upon clamping of the heatsink to the upstanding wall 66 by tightening of the screws, S, the leaf springs are flattened between the upstanding wall 66 and the side extensions 64 of the heatsink. The cantilevered portions of the leaf springs in slots 75a, 75b distort to urge the rails downwardly in FIG. 3 thereby resiliently urging the tiles into thermal coupling with the heatsink.

While only two screws are illustrated in the Figures, it will be understood that there are a series of the screws provided and spaced along the length of the printhead beneath every other tile. As may be seen in FIGS. 1 and 2, the rails each include two depending pins, P1, P2, P3, P4, at their respective ends that engage within recesses formed in the bottom cover member. Two diagonally opposite recesses R1, R4, formed in the bottom cover are slots, one (R1) elongated in the direction of the printhead, the other (R4) elonqated in a direotion transverse to this dimension. These recesses allow the tile and rail assemblage to shift relative to the bottom cover and heatsink during operation of the printhead wherein the thermal expansion occurs.

If desired, the heatsink may be adhesively attached to the tiles using a thermally conductive adhesive. In addition, a lens such as a Selfoc lens, trademark of Nippon Sheet Glass Company, Ltd., is used to focus light from the LED's and a glass cover plate placed over the bottom of member to seal the assembly from dust.

While a preferred embodiment has been described with reference to stainless steel rails and spring steel leaf springs, other materials may be used; for example, the rails may be aluminum and the leaf springs may be formed of a beryllium copper. The materials used depend on the anticipated temperature ranges of operation.

Figure 4:
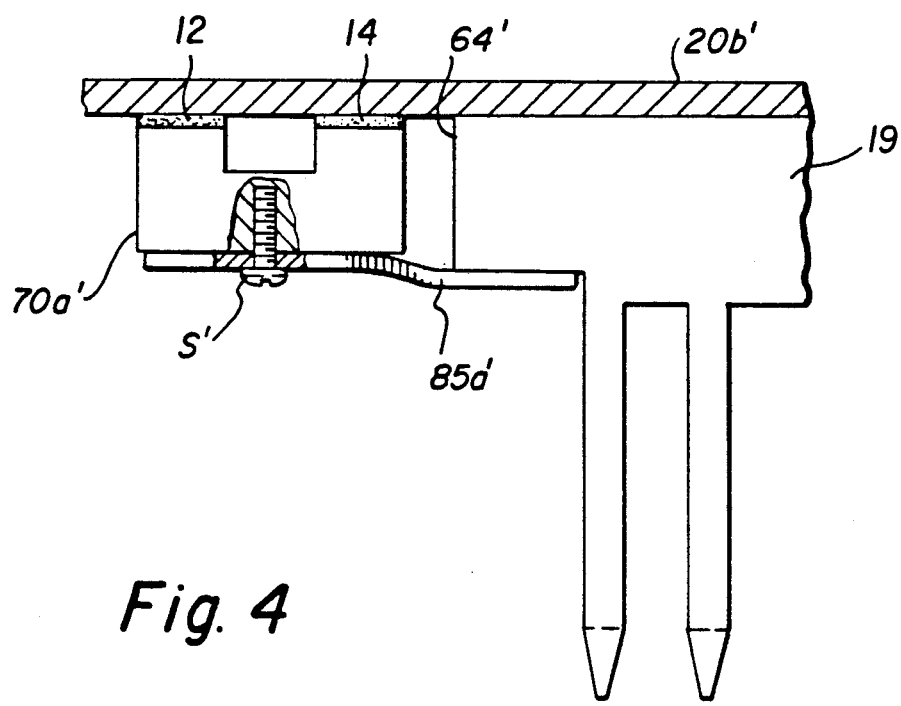
FIG. 4 is a view similar to that of FIG. 3, but illustrates an alternative embodiment of the invention.

An alternative embodiment is illustrated in FIG. 4 wherein reference numerals indicated with a prime refer to similar parts to that described for FIG. 3. In the embodiment of FIG. 4, a leaf spring 85a' is rigidly attached to a rail 70a' by screws, S'. The side extensions 64' of the heatsink engage the cantilevered end of the leaf spring to urge the rail downwardly and, thus, the tiles such as tile 20b, are urged or biased towards the heatsink. A similar arrangement is provided on the opposite side of the heatsink. In this embodiment the rail and spring could be assembled and the heatsink slid in from the end.

It will be appreciated that an improved printhead has been provided that is of relatively simple structure and provides for thermal considerations of the various parts of the assemblage.

While the invention has been described with reference to recording elements such as LED's, other recording elements such as laser diodes, ink jet, thermal, light valve, etc. may also make use of the teachings contained herein.

The invention has been described in detail with particular reference to preferred embodiments thereof, but it will be understood that variations and modifications can be effected within the spirit and scope of the invention.

What is claimed is:

1. A non-impact printhead assembly, comprising:
a plurality of modular circuit assemblies each including a plurality of recording elements and associated integrated circuit drivers;
a plurality of circuit assembly mounting tiles;
a rail mounted to said tiles, the rail including a slot;
a heatsink for supporting the tiles;
an elongated resilient strip having one elongated edge located within the slot; and
means for engaging a second elongated edge of the strip to support the strip as a cantilever; the strip being resiliently under stress in the slot to urge the tile into intimate thermal coupling with the heatsink.

2. The printhead assembly of claim 1 and wherein a plurality of rails are mounted to the tiles and wherein each rail includes a slot for resiliently engaging an elongated resilient strip.

3. The printhead assembly of claim 2 and including a cover member having a pair of upstanding walls between which the heatsink is located.

4. The printhead assembly of claim 2 and wherein the elongated strip is supported as a cantilever between an upstanding wall and the heatsink.

5. The printhead assembly of claim 4 and wherein the rails are mounted to the tiles by an adhesive.

6. The printhead assembly of claim 5 and wherein the recording elements are light-emitting diodes.

7. The printhead assembly of claim 1 and wherein the recording elements are light-emitting diodes.

8. A non-impact printhead assembly, comprising:
a plurality of modular circuit assemblies each including a plurality of recording elements and associated integrated circuit drivers;
a plurality of circuit assembly mounting tiles;
a rail mounted to said tiles,
a heatsink for supporting the tiles; and
means engaging the rail for resiliently urging the tiles into intimate thermal coupling with the heatsink.

9. The printhead assembly of claim 8 and wherein the rail includes a slot and the means for engaging the rail includes a cantilevered leaf spring having one end located in the slot and a second end supported between a wall of a cover member and the heatsink.

10. The printhead assembly of claim 8 and wherein the recording elements are light-emitting diodes.

11. The printhead assembly of claim 8 and wherein a leaf spring is mounted to said rail and cantileveredly extends to engage the heatsink.

* * * * *